United States Patent
Corniglion et al.

[11] Patent Number: 6,132,799
[45] Date of Patent: Oct. 17, 2000

[54] METHOD FOR THE MANUFACTURE OF ELECTRONIC CARDS AND CARDS OBTAINED THEREBY

[75] Inventors: Isabelle Corniglion, Auriol; Jean-Christophe Fidalgo, Gemenos; Christian Leriche, Trets, all of France

[73] Assignee: Gemplus Card International, Gemenos, France

[21] Appl. No.: 09/426,912

[22] Filed: Oct. 26, 1999

Related U.S. Application Data

[63] Continuation of application No. 08/894,265, filed as application No. PCT/FR96/00253, Feb. 15, 1996.

[30] Foreign Application Priority Data

Feb. 15, 1995 [FR] France ................................. 95 01733

[51] Int. Cl.$^7$ ............................................... B05D 3/06
[52] U.S. Cl. ........................... 427/96; 427/105; 427/487; 427/508; 427/517
[58] Field of Search ........................... 427/96, 105, 487, 427/508, 517

[56] References Cited

U.S. PATENT DOCUMENTS 5,067,008  11/1991  Yanaka et al. ............................ 357/81
5,399,847  3/1995  Droz ......................................... 235/488

FOREIGN PATENT DOCUMENTS

| 031 521 | 7/1981 | European Pat. Off. . |
| 138 121 | 4/1985 | European Pat. Off. . |
| 570 874 | 5/1993 | European Pat. Off. . |
| 570784 | 11/1993 | European Pat. Off. . |
| 636 495 | 2/1995 | European Pat. Off. . |
| 2624284 | 6/1989 | France . |
| 93/11564 | 6/1993 | WIPO . |

OTHER PUBLICATIONS

Ferdinands, Int. SAMPE Tech. Conf. (1995), 27 (diversity into the Next Century), pp 42–54.

*Primary Examiner*—Erma Cameron
*Attorney, Agent, or Firm*—Nilles & Nilles, S.C.

[57] ABSTRACT

Process for producing an electronic card comprising a micromodule inserted in the card body, wherein one layer of the body contacting the micromodule is of polymerized plastic material. A mixture containing a low viscosity liquid monomer is spread on a substrate used for producing the card and the polymerization of the monomer is initiated with a polymerization initiator. The process is particularly useful for the production of microcircuit cards such as contactless cards and advantageously uses an acrylic or methacrylic compound.

56 Claims, 3 Drawing Sheets

METHOD FOR THE MANUFACTURE OF ELECTRONIC CARDS AND CARDS OBTAINED THEREBY

CROSS-REFERENCE TO RELATED APPLICATION

This application is a continuation of U.S. Ser. No. 08/894,265, filed Nov. 13, 1997, which is a national phase application filed under 35 U.S.C. 371 of PTC application No. PCT/FR96/00253, filed Feb. 15, 1996.

BACKGROUND OF THE INVENTION

The invention relates to a method for the manufacture of electronic cards, as well as to cards obtained thereby.

The word "card" must be considered, in the present invention, in the broad sense, including especially any portable object with standardized dimensions, and comprising, firstly, a micromodule and, secondly, a body used as a portable carrier. However, the invention is aimed in particular at chip cards and, among these cards, at those cards that have contactless operations, wherein the micromodule is connected to an antenna for the electromagnetic transmission of data elements. Hereinafter in the description, the term "contactless card" will be understood to mean a card having exclusively contactless operation or else a hybrid card having contactless operation and standard contact-based operation.

The manufacture of electronic cards in large batches may be done according to different methods.

Certain methods make use of an injection, at a temperature of over 90° C. and at high pressure of about 700 kg/cm2 for example, of a polymerized viscous thermoplastic material in the molten state into an enclosed cavity of a mold. After cooling below its melting point, this material forms a thickness of the body of the card.

However, such methods do not provide the possibility of a simple adjustment of the viscosity of the plastic material injected. Now, during the designing of a method for the manufacture of cards by injection, it is necessary to perform many tests, in particular by varying the viscosity of the material injected so as to arrive ultimately at an industrially acceptable optimum method with zero defects.

SUMMARY OF THE INVENTION

The present invention is aimed at proposing a method for the large-scale manufacture of electronic cards, that overcomes the above-mentioned drawbacks at low cost and in particular enables a simple adjustment of the viscosity of the injected or dispensed plastic material.

Another aim of the invention is to make it possible to obtain card thicknesses whose characteristics, such as adhesion, rigidity or behavior under temperature can be adjusted and controlled with ease.

These aims as well as others that shall appear hereinafter are achieved by means of a method according to which, for the manufacture of the card, there is distributed a mixture comprising a liquid monomer with low viscosity. The addition of a third substance will then make it possible to adjust the viscosity of the mixture comprising said monomer.

An aim of the invention therefore is a method for the manufacture of an electronic card comprising a micromodule inserted into a card body, a layer of said card body being a polymerized plastic layer, characterized in that:

there is spread, on a substrate used for manufacturing the card, a mixture comprising a liquid monomer with low viscosity; and a polymerization of said monomer is initiated by means of a polymerization initiator.

Furthermore, an object of the invention is an electronic card comprising a micromodule inserted into a card body, a layer of said card body being a polymerized plastic layer, characterized in that said polymerized plastic layer comprises a polymer that is a homopolymer or heteropolymer of a monomer with low viscosity and a decomposition product of an initiation.

The viscosity of the monomer ranges from 100 to 1000 mPa.s approximately and is preferably lower than 500 mPa.s approximately.

BRIEF DESCRIPTION OF THE DRAWINGS

The following description, which has no restrictive character, will enable a clearer understanding of the way in which the invention can be implemented. It must be read with reference to the appended drawings, of which.

DESCRIPTION OF THE PREFERRED EMBODIMENTS

In the example of the present description, the electronic cards 1 correspond to the ISO standard 7810. They include a micromodule 2 and a card body 3.

Figure 1:
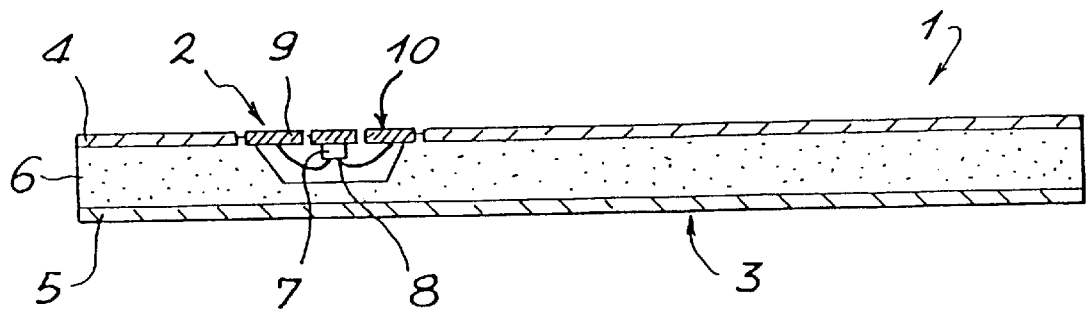
FIG. 1A gives a cross-sectional view of a contact-based card obtained by a method according to the invention.
FIG. 1B gives a cross-sectional view of a contactless card obtained by a method according to the invention.
Figure 1:
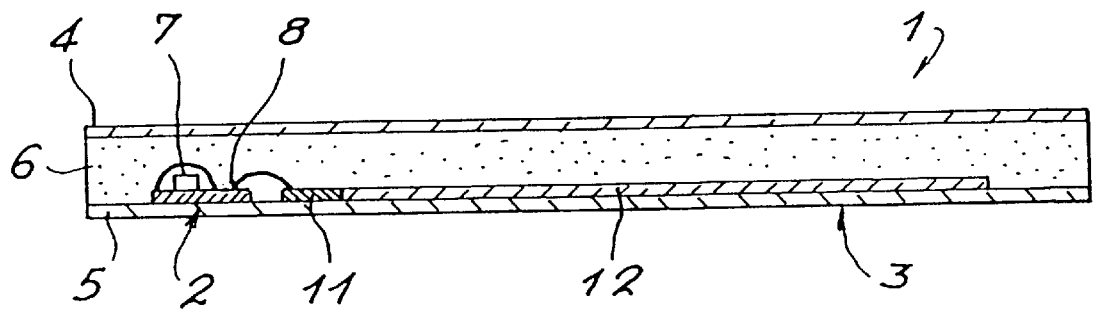

The card body 3 is a rectangular parallelepiped of small thickness whose overall dimensions are approximately 85 mm long, 54 mm wide and 0.76 mm thick. It includes n superimposed layers. The number n may be equal to one. However, in general, it is greater than one. In the example of FIGS. 1A and 1B, it is equal to three and the card body 3 then includes a top layer 4, a bottom layer 5 and a sub-layer 6.

The micromodule 2 is inserted into the card body 3. It is in contact with a polymerized plastic layer of the card body 3, for example the sub-layer 6. It has an integrated circuit chip 7 and connection terminals 8.

In the case of a contact-based card (FIG. 1A), the connection terminals 8 are connected to metallized contact pads 9 flush with the surface of the card body 3 and forming metallizations 10.

In the case of a contactless card (FIG. 1B), the connection terminals 8 are connected to contact zones 11 of an antenna 12 included in the card body 3. The antenna 12 is formed either by a coil of metal wire whose diameter is about 30 μm or a dielectric that is metallized or laminated with metal having a thickness of about 80 μm, or in the case of a microwave antenna, by a dielectric sheet whose thickness is in the region of 80 μm.

Figure 2:
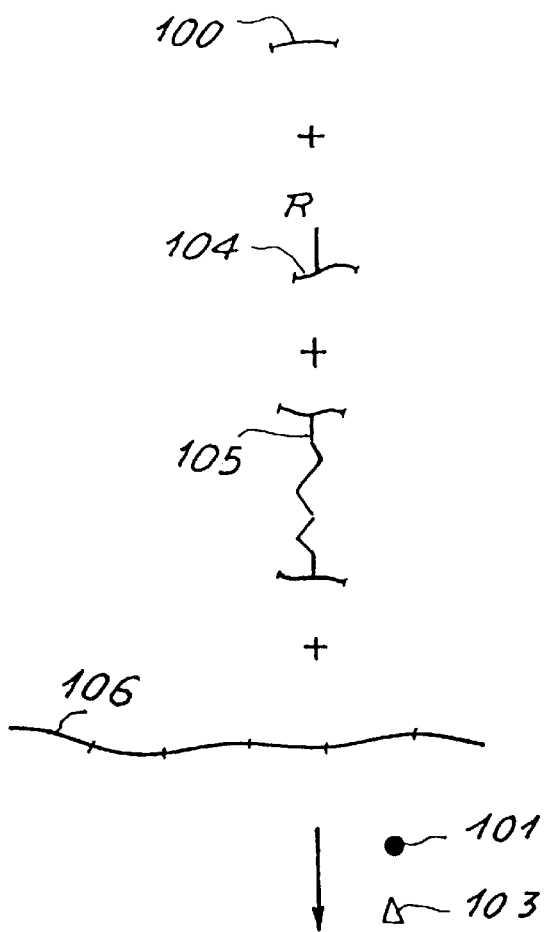
FIG. 2 illustrates the reaction scheme implemented in a method according to the invention.
Figure 2:
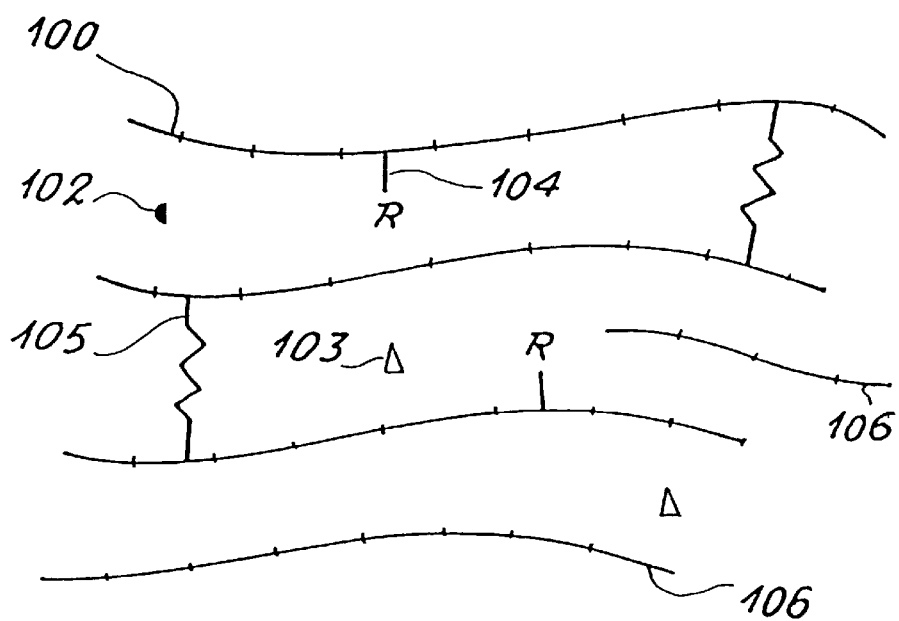

According to the invention, for the manufacture of a polymerized plastic layer 6 of the card body 3, a mixture is distributed on a substrate used for manufacturing the card 1, this mixture comprising at least one monomer referenced 100 in FIG. 2. This monomer 100 is liquid and has low viscosity. In practice, the viscosity of the monomer or monomers 100 ranges from 100 to 1000 mPa.s approximately and is preferably lower than 500 mPa.s approximately at a temperature Trep for the spreading of the mixture.

Furthermore, the polymerization of the monomer or monomers 100 is initiated or begun by means of an initiator 101. The initiator 101 may be an ionic or radical catalyst or else an actinic radiation.

Should the initiator 101 be a catalyst, it is present in the mixture during the spreading and decomposes during the initiating of the polymerization into one or more decomposition products 102 of said initiating operation.

On the contrary, should the initiator 101 be an actinic radiation such as for example an ultraviolet radiation, said initiator 101 is of course not present in the mixture but induces the decomposition of an agent of this mixture which forms a radical or an ion initiating the polymerization. Following the initiation, one or more decomposition products 102 of said initiation are found.

When the polymerization of the monomer 100 is done solely in the presence of a initiator 101, the polymerization time is great. It is greater than 15 minutes approximately. Thus, the polymerization reaction is accelerated by the addition, to the mixture comprising the initiator 101 and the monomer 100, of an accelerator 103 which by itself cannot initiate the polymerizing reaction.

According to the invention, the quantity of accelerator 103 is adjusted so as to set, in particular, the polymerization speed of the monomer 100. The greater the quantity of accelerator 103 in the mixture and the more active this accelerator 103, the faster is the polymerization and the more profitable is the method on an industrial scale.

However, a compromise has to be found with respect to the acceleration of polymerization. Indeed, an excessively fast polymerization leads to an excessively high rise in temperature due to the exothermic nature of the polymerization reaction. In practice, in the presence of a sufficient quantity of accelerator 103, the temperature of a mixture comprising solely the initiator 101 and the monomer 100 soon rises to values of the order of 80° C. Now, a temperature of this kind in particular induces the formation of bubbles whose elimination, which is necessary, is a delicate task. Besides, it may damage the micromodule or even the electronic chip of the card. Finally, it promotes shrinkage.

Furthermore, in the presence of an accelerator 103 alone, the polymerization of the monomer 100 gives rise to a brittle product, the polymer chains being generally positioned in the vicinity of one another. Furthermore, the polymerization is not complete and the non-polymerized monomer 100, which is generally volatile, spreads slowly into the atmosphere and releases an offensive odor.

Consequently, according to the invention, to the spread mixture comprising the monomer 100, the initiator 101 and the accelerator 103, there are added a simple intercalary compound 104, an elastomer intercalary compound 105 and a polymer 106. Other compounds however may be introduced into the mixture, especially a mineral charge making it possible, for example, to adjust the whiteness of the polymerized layer obtained. In one example, the mineral charge is a calcium carbonate charge.

The simple intercalary compound 104 is a monomer that is compatible with the monomer 100 with, however, a chemical R radical designed to move the adjacent polymer chains away to a distance sufficient to give the polymerized layer a degree of elasticity and flexibility greater than that which would be obtained with the monomer 100 alone.

The intercalary elastomer compound 105 is a difunctional polymer with the property of being intercalated in and between two adjacent polymer chains with a view to a reticulation of the polymerized layer. The elastomer segment of the compound 105 is used especially to totally adjust the flexibility of the polymerized layer without however increasing its brittleness.

The intercalary compounds 104 and 105 furthermore cause the adjacent polymer chains to be at a distance from each other that is sufficient for the polymerization of the monomer 100 to be total, the offensive odor being then eliminated.

The polymer 106 is compatible with the monomer 100, i.e. it can be mixed with it. This is the case especially when said polymer 106 is a homopolymer of the monomer 100. This is also the case when this polymer 106 is a homopolymer or heteropolymer type of polymer that dissolves in the monomer 100. Furthermore, the polymer 106 may come from the fast polymerization of a monomer different from the monomer 100. Through monomers of this kind, the viscosity, during the spreading operation, may be kept at a very low level.

The polymerization reactions have a threshold above which they are said to be accelerated. This is the gel (or Trommsdorff) effect which is observed in acrylic and methacrylic monomers. In practice, this threshold varies between 2 and 20% of polymerization of the monomer or monomers present in the mixture. Thus, if a polymer/(polymer+monomer) ratio of the mixture spread is adjusted advantageously as a function of the monomer or monomers 100, 104, 105 present, their viscosity and their reactivity, all with a specified content of initiator 101 and accelerator 103 so that said ratio has a value of 2/100 to 20/100 or more, then the polymerization is then accelerated at the outset.

Choosing a polymer/(monomer+polymer) ratio greater than the threshold of the gel effect has advantages. It makes it possible, firstly, to further reduce the total time of polymerization of the monomers 100, 104, 105. It also makes it possible to limit the quantity of total heat released by the exothermic reaction of polymerization, a part of the compounds of the mixture being already polymerized. This further makes it possible to limit the shrinking of the polymerized material on the card manufacturing substrate and around the micromodule and finally, as the case may be, if the polymer is not a homopolymer of the monomer and if said polymer is more flexible than said homopolymer of the monomer, to provide greater flexibility and a plasticizing effect on the polymerized layer obtained.

However, choosing a polymer/(monomer+polymer) ratio greater than the threshold of the gel effect has a major drawback: it increases the viscosity of the mixture. The distribution of the material spread on the card manufacturing substrate then takes place with greater difficulty which, in particular, calls for the spreading of the mixture under greater pressure. It will be observed that this distribution is a critical problem in the manufacture of chip cards where the cavities of the molds have a very small depth, which does not facilitate the flow of the fluids.

A compromise therefore has to be found with respect to the viscosity of the mixture that is spread.

A compromise of this kind differs greatly, depending in particular on the type of card manufactured or even, on the method used to manufacture cards of a particular type.

For example, in the case of the manufacture of contactless cards by injection, the injection pressure is advantageously low in view of the brittleness of the antenna. Thus, the viscosity of the material spread is chosen with care, so that it is small enough not to damage the antenna and strong enough if necessary to cause a gel effect.

Similarly, in the case of the manufacture of contactless type cards by simple dispensing, for example according to the method described in the French patent application filed on Sep. 13, 1994 under No. 94 10920, which proposes a distribution of the material dispensed along the antenna by guidance, the polymer/(monomer+polymer) ratio is chosen so that it is close to the threshold of acceleration of polymerization by gel effect, the chosen viscosity thus being as small as possible.

By contrast, in the case of a manufacture of contact-based cards with injection, the injection pressure may be greater since there is no antenna and the viscosity of the spread mixture is advantageously greater than the above-mentioned values of viscosity.

Figure 3:
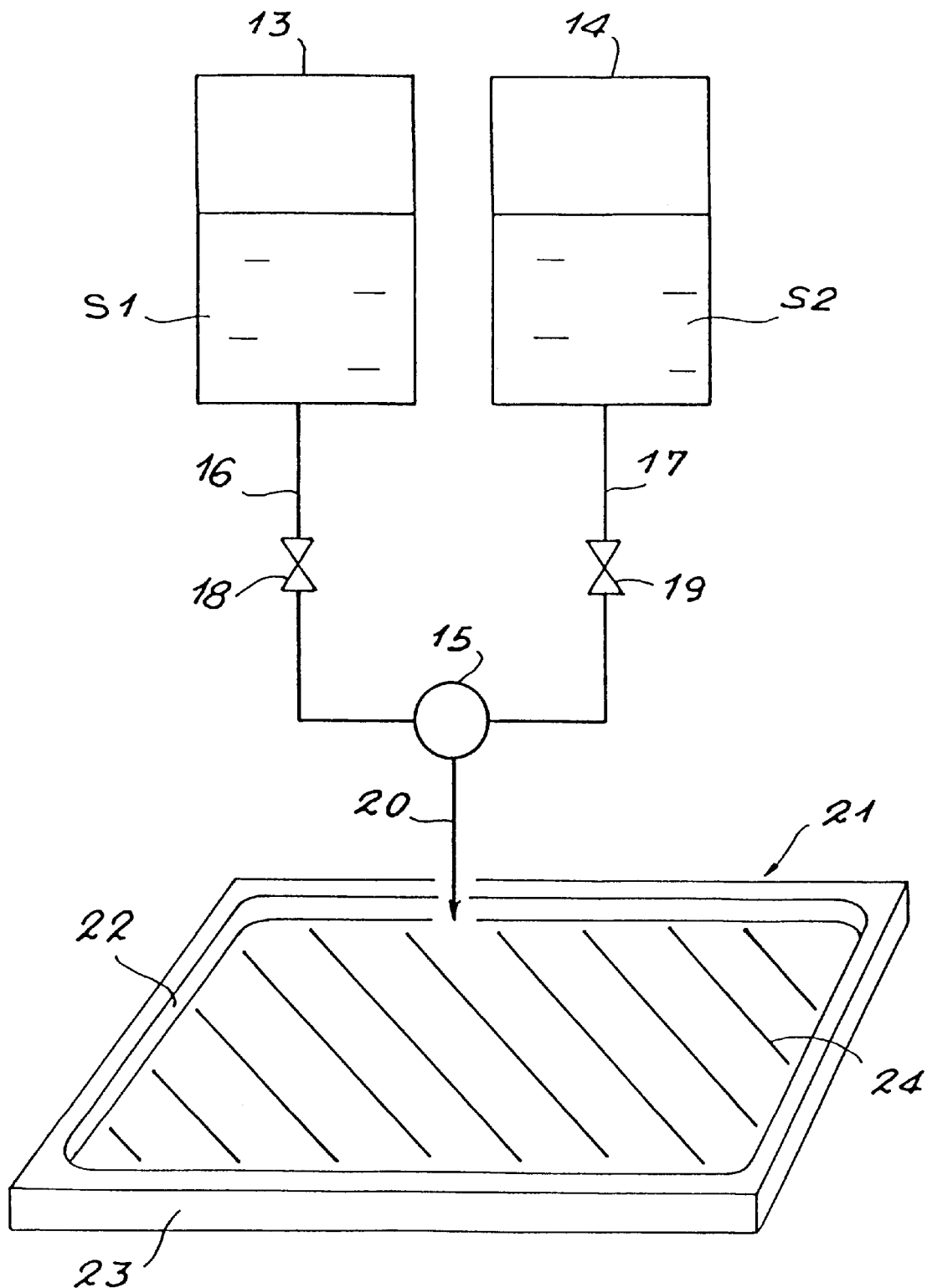
FIG. 3 gives a schematic view of a mode of implementation of the method of the invention.

In one mode of implementation of the method of the invention shown in FIG. 3, the monomer 100, initiator 101, accelerator 103, simple intercalary compound 104, elastomer intercalary compound 105, and polymer 106 are preserved between two storage containers 13 and 14 under storage conditions such that said monomer 100 is substantially stable in time, i.e. such that the polymerization of said monomer 100 does not occur to a significant degree.

Naturally, the number of containers is not limited to two. For example, it is possible to have six different containers, each container having a compound 100, 101, 103, 104, 105 or 106.

Each container 13 or 14 may contain a solution with one or more of the following compounds: monomer 100, initiator 101, accelerator 103, simple intercalary compound 104, elastomer intercalary compound 105 and polymer 106. However, a container 13, 14 cannot, at the same time, contain the monomer 100, the accelerator 103 and the initiator 101. Furthermore, the initiator 101 is preferably introduced into the least reactive monomer solution. Finally, the containers advantageously contain both the monomer 100 and the polymer 106 so that the two solutions have viscosity values that are close to each other.

Thus, in the example of FIG. 3, the container 13 has a solution S1 comprising the compound 100, 101, 104, 105 and 106 while the container 14 has a solution S2 comprising the compounds 100, 103, 104, 105 and 106.

The containers 13 and 14 are connected to a mixer head 15 by conduits respectively referenced 16 and 17. The flow rate of the mixture M1 in the conduit 16 is regulated by a valve 18 while the flow rate of the mixture M2 in the conduit 17 is regulated by a valve 19. The mixture of the solution S1 and S2 and therefore of the initiator 101 and of the accelerator 103 is done in the mixer head 15 in a ratio S1/S2 controlled by the valves 18 and 19. This mixture has a temperature Tmel. In one example, Tmel equals 25° C.

Given the fact that the final mixture comprising both the initiator 101 and the accelerator 103 reacts at high speed and that the polymerized layer obtained may be a thermosetting (reticulate) and insoluble layer, advantageously a self-cleaning high pressure mixer head 15 is used. However, if the polymerized layer obtained is thermoplastic (non-reticulate) and soluble, a low-pressure mixer head may be used.

In the embodiment shown in FIG. 3, the spreading is a simple dispensing of the mixture coming from the mixer head 15 and conveyed by a conduit 20 to a substrate 21 for the manufacture of the cards 1. This substrate 21 is then formed by an open cavity 22 of a half-mold 23, called a crown, positioned on a sheet 24 designed to form a bottom layer of the card body 3. The spreading is done under reduced pressure which is in the range of atmospheric pressure.

However, in other modes of preparation, the manufacturing substrate 21 is formed by an alveolate frame such as the one described in the French patent application filed on Feb. 24, 1994 under No. 94 02130, and in yet other modes of preparation, the spreading is a pressurized injection into a closed cavity of a mold having the format of the card or of the layer to be obtained.

Naturally, the micromodule 2 and, if necessary, the antenna 12 may be present during the spreading on the manufacturing substrate 21. They may however be inserted into the spread mixture while the polymerization of said mixture is not sufficient to take its viscosity to excessive values of over 10,000 mPa.s approximately.

A lamination of this spread mixture may be done, for example, between two rollers in order to speedily obtain predetermined thicknesses of the card body. Furthermore, a lamination of this kind can be considered only with viscosity values and polymerization speeds that are particularly adapted and compatible, especially with a no-flow spread subsequent to said lamination, on a lower film, with a unit formed by a lower film and a laminated mixture being overlapped by a second film designed to form a top layer of the card body.

Furthermore, a lamination may be obtained after a step for the spreading, in an open cavity, of a crown mold and after the application of an upper film designed to form a top layer on the card body, following the demolding and the cutting out of the top and bottom films. It will be observed that, in this case the films applied adhere naturally to the spread mixtures, the polymerization of said materials being not entirely terminated at the stage of the application of said films.

Furthermore, an operation of initiation by radiation may be done once the mixture has been spread, for example, by the opening of an open cavity of the substrate 21 for the manufacture of a card. It will be observed that if the mixture of the monomer 100, the initiator 101, the accelerator 103, the compounds 104, 105 and the polymer 106 is done directly on the substrate for the manufacture of the card 1, then the above-mentioned steps of mixing, spreading and activation of the method of the invention will then be merged together.

According to the invention, the sets of valves 18, 19 can be used, by the variation of their apertures, to easily choose a compromise between all the constraints referred to in order to obtain a satisfactory product. From this viewpoint, the approach of the invention is far better than that of the prior approaches referred to. Indeed, with these earlier approaches, with each new shape and each new constraint or surface appearance to be modified for example, it was necessary to carry out numerous painstaking tests, and build numerous molds before selecting an appropriate method and mold. Through the possibilities of adjusting the method according to the invention, efficient compromises can be obtained swiftly by simple steps for the adjustment of the ratio. Such compromises have enabled the devising of card manufacturing methods wherein thermosetting materials are polymerized at temperatures below 70° C. approximately and in the range of 50° C. approximately while the viscosity of the materials spread is lower than 10,000 mPa.s, giving 5000 mPa.s.

For the implementation of the invention, advantageously the material used is a mixture based on an acrylic or methacrylic monomer. In particular, the following monomers are used:

methyl methacrylate (MMA),
ethyl triglycol methacrylate (ETMA),
2-hydroxyethyl methacrylate (HEMA),
ester of methacrylic acid (C13MA),
isobornyl methacrylate (IBOMA),
isobornyl acrylate (IBA),
dicyclopentenyloxyethyl methacrylate (DPOMA),
tetrahydrofurfuryl metharcylate (THFMA),
n-butyl methacrylate (BMA),
benzyl methacrylate (BNMA),
2, dimethylaminoethyl-methacrylate (DMAEMA),
butanediol 1,4-dimethacrylate (BDDMA),
diethyleneglycol dimethacrylate (DEGDMA),
diurethane dimethacrylate (DDMI),
dodecandiol 1,12 dimethacrylate (DDDMA), and
trimethyiolpropantrimethacrylate (TMPTMA).

Let us now consider the example of methyl methacrylate (MMA). Polymethyl methacrylate (PMMA) obtained by the polymerization of MMA is particularly suited to the coating of inserts.

However, the polymerization of MMA is known to be highly exothermic and to show substantial shrinkage requiring, in the field of card manufacture, the selection of efficient compromises by precise adjustments depending on the type of card and method chosen.

In the presence of a simple radical initiator, such as a peroxide, or ultraviolet radiation, the MMA polymerizes and then PMMA is obtained. However, this polymerization is slow. For example, it takes about 45 minutes in the presence of benzoyl peroxide.

Hence, the polymerization of MMA is accelerated by a tertiary amine such as for example N,N-bis(2-hydroxyethyl)-p-toluidine. Though this amine, the polymerization time is considerably reduced. It is in the range of 15 minutes. However, the product obtained proves to be brittle, has a large number of bubbles and gives rise to the spread of an offensive odor.

However, by using triethyleneglycol monomethyl methacrylate (TEGMA) or HEMA as the simple intercalary compound and dimethacrylic polybutadiene (DMPB) as the elastomer intercalary compound, the flexibility of the polymer layer or the card obtained is adjusted and the release of offensive odors is prevented.

Furthermore, by the addition, into the mixture, of PMMA, a polymer compatible with MMA or a monomer whose polymerization is very fast, such as for example a cyanoacrylic compound, a polymer/(monomer+polymer) ratio of about 20% is achieved immediately or very swiftly during the mixing operation and the polymerization time is then reduced by gel effect. In practice, this total polymerization time that is reached is in the range of 6 minutes.

Furthermore, advantageously, a charge of titanium dioxide ($TiO_2$) is introduced into the mixture in order to whiten the polymerized layer obtained.

The following examples are given by way of an illustration that in no way restricts the scope of the invention.

In a first example, pertaining especially to the manufacture of contactless cards by simple dispensing into an open cavity, the solutions S1 and S2, stored at ambient temperature in the containers 13 and 14 have the following composition, the percentages being given in weight:

| S1: | |
|---|---|
| MMA (100) | 53.3% |
| amine (103) | 4.6% |
| PMMA (106) | 33.3% |
| $TiO_2$ | 8.6% |
| S2: | |
| MMA (100) | 41.5% |
| peroxide (101) | 7.7% |
| PBDM (105) | 41.5% |
| $TiO_2$ | 9.2% |

If, at Tmel equal to ambient temperature, 10.5 g of S1 is mixed with 6.5 g of S2, a mixture M is obtained whose composition is as follows, the percentages being given by weight:

| M: | |
|---|---|
| MMA (100) | 48.8% |
| peroxide (102) | 2.9% |
| amine (103) | 2.9% |
| PBDM (105) | 15.9% |
| PMMA (106) | 20.6% |
| $TiO_2$ | 8.8% |

The polymerization of this mixture is done in less than 6 minutes at a temperature of less than 50° C.

At this temperature as well as at higher temperatures, the MMA is liquid and its viscosity is below 100 mPa.s approximately. The viscosity of this monomer is therefore far less than the viscosities of the thermoplastic materials used in the methods for the manufacture of prior art cards where the viscosity values exceeded 10,000 mPa.s.

Naturally, the quantities of MMA, PMMA, amine and peroxide are adjusted in the solutions S1 and S2 and in the mixture M by means of the valves 18 and 19. Consequently, through the above-mentioned constituent elements combined together in adjustable proportions, simple means are available to devise a fast adjustment of a mold and the obtaining of an optimal method that is industrially acceptable. If Tmel and Trep are in the range of the ambient temperature, the maximum temperature obtained during polymerization increases, under such conditions, up to about 45° C. while the viscosity of the mixture is, at Trep, in the range of 1000 mPa.s.

In a second example, the gel effect is prompted by triggering the very fast polymerization of cyanoacrylate monomers (CNA) by anionic means, through the intervention of a base catalyst: an amine. During the mixing operation, the ratio PMMA/(CNA+MMA+PMMA) is not sufficient to trigger the gel effect. However, the amine triggers fast or even instantaneous polymerization of the CNA into polycyanoacrylate (PCNA). Thus, the ratio (PMMA+PCNA)/(MMA+PMMA+PCNA) becomes sufficient to generate a gel effect in the mixture and accelerate the polymerization of the MMA activated by the combination of peroxide/amine. The solutions S1 and S2 stored at ambient temperature in the containers 13 and 14 have the following composition, the percentages being given by weight:

| S1: | |
|---|---|
| MMA (100) | 48.4% |
| peroxide (101) | 3.2% |
| CNA (106) | 16.1% |
| PMMA (106) | 32.3% |

| S2: | |
|---|---|
| MMA (100) | 57.7% |
| amine (103) | 3.8% |
| PMMA (106) | 38.5% |

If 10.3 g of S1 is mixed with 8.7 g of S2 at Tmel equal to the ambient temperature, then a mixture M is obtained with the following composition, the percentages being given by weight.

| M: | |
|---|---|
| MMA (100) | 52.7% |
| peroxide (102) | 1.75% |
| amine (103) | 1.75% |
| PCNA (106) | 8.7% |
| PMMA (106) | 35.1% |

The polymerization of this mixture is done in less than 5 minutes at a temperature of about 55° C., the increase of 10° C. with respect to the above-mentioned temperature of 45° C. being due especially to the polymerization of CNA.

In a third example, HEMA was introduced into the mixture.

The solutions S1 and S2, stored at ambient temperature in the containers 13 and 14, then have the following composition, the percentages being given by weight:

| S1: | |
|---|---|
| MMA (100) | 15.8% |
| peroxide (101) | 3.5% |
| HEMA (104) | 60.7% |
| PBDM (105) | 20% |

| S2: | |
|---|---|
| MMA (100) | 20% |
| amine (103) | 1.9% |
| HEMA (104) | 61.9% |
| PBDM (105) | 16.1% |

If 10 g of S1 is mixed with 10 g of S2 at Tmel equal to the ambient temperature, then a mixture M is obtained with the following composition, the percentages being given by weight

| M: | |
|---|---|
| MMA (100) | 20% |
| peroxide (102) | 1.75% |
| amine (103) | 0.95 |
| HEMA (104) | 61.3% |
| PBDM (105) | 16.0% |

HEMA may ultimately form an elastomer intercalary compound. Thus, the polymerization of MMA will be total and no offensive odor will be released.

In a fourth example, the MMA is eliminated. The solutions S1 and S2, stored at ambient temperature, then have the following composition, the percentages being given by weight:

| S1: | |
|---|---|
| HEMA (100) | 76% |
| peroxide (101) | 4% |
| PBDM (105) | 20% |

| S2: | |
|---|---|
| HEMA (100) | 77.4% |
| amine (103) | 2.4% |
| PBDM (105) | 20.2% |

If 10 g of S1 ix mixed with 10 g of S2 at Tmel equal to the ambient temperature, then a mixture M is obtained with the following composition, the percentages being given by weight.

| M: | |
|---|---|
| HEMA (100) | 76.7% |
| peroxide (101) | 2% |
| amine (103) | 1.20% |
| PBDM (105) | 20.1% |

However, the adhesion of the above-mentioned mixture is low.

The compromises selected by means of simple adjustments of factors such as viscosity and speed or total polymerization time enable the fast selection of an appropriate method for the manufacture of cards as well as of the mold used.

The cards obtained by the method according to the invention with the use of the acrylic or methacrylic system are, whether they are contact-based cards or contactless cards, flexible, hard and shock-resistant, with good surface condition. The choice of the monomers and of the modifying polymers such as, for example butyl acrylate or methacrylate, enable the setting of the precise qualities of the cards.

Naturally, different thermosetting monomer/polymer reagent systems that enable fast synthesis of polymerized compounds through a reaction of activated chain elongation may be applied according to the method of the invention and, in particular, acrylic or methacrylic systems other than the MMA/PMMA system, β epoxy systems that polymerize, for example, by cationic means and polyurethane systems that polymerize for example by heating at temperatures beyond a limit reaction temperature.

The monomers 100 are chosen for their characteristics and impact on the polymerized layer 6. MMA is chosen for adhesion and rigidity, THFMA is chosen for adhesion, IBOMA is chosen for behavior under temperature and TMPTMA for rigidity. With a mixture of monomers 100, there is thus found a compromise for adhesion, rigidity and behavior under temperature of the layer 6.

What is claimed is:

1. Method for the manufacture of an electronic card comprising a micromodule inserted into a card body having a polymerized plastic layer, wherein said polymerized plastic layer of said card body is formed through the steps comprising:

applying a polymerizable monomer-containing mixture comprising a liquid monomer with a viscosity within the range of 100 to 1000 mPa.s onto a card body substrate; and polymerizing said monomer by means of a polymerization initiator.

2. Method according to claim 1 wherein, the viscosity of the polymerizable monomer-containing mixture comprising the monomer is less than approximately 500 mPa.s.

3. Method according to claim 1 wherein,
the polymerization of the monomer is accelerated by adding an accelerator so as to increase the rate of polymerization.

4. Method according to claim 1 wherein,
a simple intercalary compound comprising a monomer that is compatible with said liquid monomer, and bears an R radical, wherein said R radical is designed to move adjacent polymer chains away to a distance sufficient to give the polymerized layer a degree of elasticity and flexibility treater than that which would be obtained when the monomer alone is combined with said liquid monomer.

5. Method according to claim 1 wherein,
an elastomer intercalary compound comprising a difunctional polymer, said difunctional polymer having the property of being intercalated in and between two adjacent polymer chains with a view to the reticulation of the polymerized layer, is added to the polymerizable monomer-containing mixture.

6. Method according to claim 1 wherein, a polymer combinable with the monomer is added to the polymerizable monomer-containing mixture.

7. Method according to claim 6 wherein,
the polymer/(monomer+polymer) ratio is at least 2/100.

8. Method according to claim 6 wherein,
the polymer/(polymer+monomer) ratio is within the range of 2/100 to 20/100.

9. Method according to claim 3 wherein, the polymerizable monomer-containing mixture is made out of two separate solutions, a first solution comprising the initiator, a second solution comprising the accelerator.

10. Method according to claim 9 wherein,
the polymerizable monomer-containing mixture is injected into a cavity of a mold.

11. Method according to claim 1 wherein,
the polymerizable monomer-containing mixture is dispensed under reduced pressure into an open cavity of a mold.

12. Method according to claim 1 wherein,
the card body substrate is laminated with the polymerizable monomer-containing mixture.

13. Method according to claim 1 wherein, the electronic card is a contactless electronic card comprising an antenna in contact with the polymerized plastic layer.

14. Method according to claim 1 wherein at least one of, an acrylic and methacrylic monomer is used as the monomer.

15. Method according to claim 14, characterized in that the acrylic or methacrylic monomer is selected from the group consisting of:
methyl methacrylate;
ethyl triglycol methacrylate;
2-hydroxyethyl methacrylate;
ester of methacrylic acid;
isobornyl methacrylate;
isobornyl acrylate;
dioxyethyl cyclopentenyl methacrylate;
tetrahydrofurfuryl methacrylate;
n-butyl methacrylate;
benzyl methacrylate;
2-(dimethyl amino ethyl) methacrylate;
1,4-Butanediol, dimethacrylate;
diethyleneglycol, dimethacrylate;
diurethane dimethacrylate;
1,12-dodecandiol, dimethacrylate; and
trimethylol propane dimethyacrylate.

16. Method according to claim 15 wherein the initiator is a peroxide and further comprising an amine accelerator.

17. An electronic card comprising a micromodule inserted into a card body, a layer of said card body being a polymerized plastic layer, wherein said polymerized plastic layer is formed of a composition comprising:
a polymer that is a homopolymer or heteropolymer of a monomer, said monomer having a viscosity within the range of approximately 100 to 1000 mPa.s; and
a decomposition product of an initiation of the polymerization of the polymer.

18. A card according to claim 17, the composition further comprises an accelerator.

19. A card according to claim 17 wherein, the composition further comprises a simple intercalary compound, said simple intercalary compound comprising a monomer including an R radical, wherein said R radical is designed to move adjacent polymer chains away to a distance sufficient to give the polymerized layer a degree of elasticity and flexibility greater than that which would be obtained with the polymer alone.

20. A card according to claim 17 wherein, the composition further comprises an elastomer intercalary compound, said elastomer intercalary compound comprising a difunctional polymer, said difunctional polymer having the property of being intercalated in and between two adjacent polymer chains with a view to the reticulation of the polymerized layer.

21. A card according to claim 17 wherein the monomer is one of a methacrylic monomer and a acrylic monomer.

22. A card according to claim 21 wherein the monomer, is selected from the group consisting of:
methyl methacrylate;
ethyl triglycol methacrylate;
2-hydroxyethyl methacrylate;
ester of methacrylic acid;
isobornyl methacrylate;
isobornyl acrylate;
dioxyethyl cyclopentenyl methacrylate;
tetrahydrofurfuryl methacrylate;
n-butyl methacrylate;
benzyl methacrylate;
2-(dimethyl amino ethyl) methacrylate;
1,4-Butanediol, dimethacrylate;
diethyleneglycol, dimethacrylate;
diurethane dimethacrylate;
1,12-dodecandiol, dimethacrylate; and
trimethylol propane dimethyacrylate.

23. A card according to claim 17 wherein, the viscosity of the polymer is less than approximately 500 mPa.s.

24. A card according to claim 17 wherein said card is contactless.

25. A method of manufacturing an electronic card having a polymerized plastic layer comprising the steps of:
(A) inserting a micromodule into a cavity in a card body substrate; and
(B) forming a polymerized plastic layer around said micromodule through the steps comprising:
(1) filling said cavity with a polymerizable monomer-containing mixture comprising:
(a) a monomer with a viscosity within the range of 100 to 1000 mPa.s; and,
(b) an additive for adjusting the rate of polymerization selected from the group comprising:
(i) an initiator;
(ii) a simple intercalary compound bearing an R radical wherein said R radical is designed to move adjacent polymer chains away to a distance sufficient to give the polymerized layer a degree of elasticity and flexibility greater than that which would be obtained with the monomer alone; and
(iii) an elastomer intercalary compound; and
(2) polymerizing said polymerizable monomer-containing mixture to form said layer.

26. A method according to claim 25 wherein said mixture has a viscosity less than approximately 500 mPa.s.

27. A method according to 25 further comprising exposing the polymerizable monomer-containing mixture to an accelerator to increase the rate of polymerization.

28. A method according to claim 25 wherein the initiator is radiation.

29. A method according to claim 27 wherein the polymerizable monomer-containing mixture further comprises a polymer that can be mixed with said monomer.

30. A method according to claim 29 wherein the ratio of polymer/(monomer+polymer) is at least 2/100.

31. A method according to claim 29 wherein the ratio of polymer/(monomer+polymer) is within the range of 2/100 to 20/100.

32. A method according to claim 29 wherein the polymerizable monomer-containing mixture is injected into the cavity.

33. A method according to claim 25 wherein the polymerizable monomer-containing mixture is spread into the cavity.

34. A method according to claim 25 wherein the monomer is an acrylic monomer or a methacrylic monomer.

35. A method according to claim 25 wherein the monomer is selected from the group consisting of:
methyl methacrylate;
ethyl triglycol methacrylate;
2-hydroxyethyl methacrylate;
ester of methacrylic acid;
isobornyl methacrylate;
isobornyl acrylate;
dioxyethyl cyclopentenyl methacrylate;
tetrahydrofurfuryl methacrylate;
n-butyl methacrylate;
benzyl methacrylate;
2-(dimethyl amino ethyl) methacrylate;
1,4-Butanediol, dimethacrylate;
diethyleneglycol, dimethacrylate;
diurethane dimethacrylate;
1,12-dodecandiol, dimethacrylate; and
trimethylol propane dimethyacrylate.

36. A method according to claim 25 further comprising contacting an antenna with the polymerized plastic layer.

37. A method according to claim 27 wherein said initiator is peroxide and said accelerator is an amine.

38. An electronic card comprising;
(a) a card body having a cavity;
(b) a micromodule inserted into said cavity; and,
(c) a polymerized plastic layer formed through the steps comprising;
(1) filling said cavity with a mixture comprising:
(a) a monomer with a viscosity within the range of 100 to 1000 mPa.s; and,
(b) an additive for adjusting the rate of polymerization selected from the group comprising:
(i) an initiator;
(ii) a simple intercalary compound bearing an R radical wherein said R radical is designed to move adjacent polymer chains away to a distance sufficient to give the polymerized layer a degree of elasticity and flexibility greater than that which would be obtained with the monomer alone; and
(iii) an elastomer intercalary compound;
(2) polymerizing said mixture to form said layer surrounding said micromodule.

39. A card according to claim 38 wherein said polymerizable monomer-containing mixture has a viscosity less than approximately 500 mPa.s.

40. A card according to 38 further comprising exposing the polymerizable monomer-containing mixture to an accelerator to increase the rate of polymerization.

41. A card according to claim 40 wherein the accelerator is radiation.

42. A card according to claim 38 wherein the polymerizable monomer-containing mixture further comprises a polymer that can be mixed with said monomer.

43. A card according to claim 42 wherein the ratio of polymer/(monomer+polymer) is at least 2/100.

44. A card according to claim 42 wherein the ratio of polymer/(monomer+polymer) is within the range of 2/100 to 20/100.

45. A card according to claim 42 wherein the polymerizable monomer-containing mixture is injected into the cavity.

46. A card according to claim 42 wherein the polymerizable monomer-containing mixture is spread into the cavity.

47. A card according to claim 38 wherein the monomer is an acrylic monomer or a methacrylic monomer.

48. A card according to claim 38 wherein the monomer is selected from the group consisting of:
methyl methacrylate;
ethyl triglycol methacrylate;
2-hydroxyethyl methacrylate;
ester of methacrylic acid;
isobornyl methacrylate;
isobornyl acrylate;
dioxyethyl cyclopentenyl methacrylate;
tetrahydrofurfuryl methacrylate;
n-butyl methacrylate;
benzyl methacrylate;
2-(dimethyl amino ethyl) methacrylate;
1,4-Butanediol dimethacrylate;
diethyleneglycol, dimethacrylate;
diurethane dimethacrylate;
1,12-dodecandiol, dimethacrylate; and
trimethylol propane dimethyacrylate.

49. A card according to claim 38 further comprising contacting an antenna with the polymerized plastic layer.

50. A card according to claim 40 wherein said initiator is peroxide and said accelerator is an amine.

51. An electronic card comprising:
(a) a card body having a cavity;
(b) a micromodule inserted into said cavity; and,
(c) a polymerized plastic layer surrounding said micromodule, formed through the polymerization of a mixture comprising:
  (1) a monomer with a viscosity within the range of approximately 100 to 1000 mPa.s; and
  (2) an additive for the adjustment of the rate of polymerization selected from the group comprising:
    (a) an initiator;
    (b) a simple intercalary compound bearing an R radical wherein said R radical is designed to move adjacent polymer chains away to a distance sufficient to give the polymerized layer a degree of elasticity and flexibility greater than that which would be obtained with the monomer alone;
    (c) an elastomer intercalary compound; and,
    (d) a polymer, wherein the ratio of polymer/(polymer+monomer) is at least 2/100.

52. The electronic card of claim 51 wherein said ratio of polymer: monomer is at least approximately 2/100.

53. The electronic card of claim 52 wherein the ratio of polymer: monomer is within the range of approximately 2/100 to 20/100.

54. A method of manufacturing an electronic card comprising the steps of:
(1) providing a card body having a cavity;
(2) inserting a micromodule into the cavity in said card body;
(3) filling the cavity in said card body with a mixture comprising:
  (A) a polymerizable monomer having a viscosity of 100–1000 mPa.s; and
  (B) an additive for the adjustment of the rate of polymerization selected from the group consisting of:
    (1) an initiator;
    (2) a simple intercalary compound bearing an R radical wherein said R radical is designed to move adjacent polymer chains away to a distance sufficient to give the polymerized layer a degree of elasticity and flexibility greater than that which would be obtained with the greater than that which would be obtained with the monomer alone;
    (3) an elastomer intercalary compound; and,
    (4) a polymer, wherein the ratio of polymer/(polymer+monomer) is at least 2/100; and
    (5) polymerizing said mixture.

55. The method of claim 54 wherein the polymer:monomer ratio is at least approximately 2/100.

56. The method of claim 54 wherein the polymer:monomer ratio is within the range of approximately 2/100–20/100.

* * * * *